(12) United States Patent
Nikonov et al.

(10) Patent No.: US 12,020,144 B2
(45) Date of Patent: Jun. 25, 2024

(54) OSCILLATOR BASED NEURAL NETWORK APPARATUS

(71) Applicant: Intel Corporation, Santa Clara, CA (US)

(72) Inventors: Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1181 days.

(21) Appl. No.: 16/579,765

(22) Filed: Sep. 23, 2019

(65) Prior Publication Data
US 2021/0089876 A1    Mar. 25, 2021

(51) Int. Cl.
*G06N 3/065*    (2023.01)
*G06N 3/048*    (2023.01)
*H03M 1/66*    (2006.01)

(52) U.S. Cl.
CPC .............. *G06N 3/065* (2023.01); *G06N 3/048* (2023.01); *H03M 1/66* (2013.01)

(58) Field of Classification Search
CPC ..................................................... G06N 3/065
See application file for complete search history.

(56) References Cited

U.S. PATENT DOCUMENTS

| | | | |
|---|---|---|---|
| 6,957,204 B1 | 10/2005 | Hoppensteadt et al. | |
| 9,092,730 B2 | 7/2015 | Esterline et al. | |
| 9,705,521 B1 * | 7/2017 | Monk | H03M 1/0665 |
| 2007/0239635 A1 * | 10/2007 | Yoshiike | G06N 3/02 706/15 |
| 2008/0016014 A1 * | 1/2008 | Sigal | G06N 3/02 706/15 |
| 2008/0309421 A1 * | 12/2008 | Wormer | H03L 7/093 331/1 A |
| 2016/0125288 A1 * | 5/2016 | Pileggi | G06N 3/049 706/29 |
| 2017/0286830 A1 * | 10/2017 | El-Yaniv | G06N 3/045 |

(Continued)

FOREIGN PATENT DOCUMENTS

EP    2742467 A1    6/2014

OTHER PUBLICATIONS

Jackson, T.C., Shi, R., Sharma, A.A. et al. Implementing delay insensitive oscillatory neural networks using CMOS and emerging technology. Analog Integr Circ Sig Process 89, 619-629 (2016). https://doi.org/10.1007/s10470-016-0803-4 (Year: 2016).*

(Continued)

*Primary Examiner* — James D. Rutten
(74) *Attorney, Agent, or Firm* — NICHOLSON DE VOS WEBSTER & ELLIOTT LLP (57) ABSTRACT

A neural network scheme is described that uses unsupervised learning in oscillator neural networks. Training occurs by varying the weights in proportion to the output from a frequency detector. Inputs and initial weights are split into plurality of inputs and plurality of weights. These split inputs and weights can be analog or digital. Oscillators generate signals having frequencies that represent difference in inputs, initial weights, and adjusted factors. Frequency detectors are used to compare the oscillator frequencies with a synchronized frequency of all oscillators. The output of the frequency detectors are used to generate the adjusted factors, and in turn generate trained weights.

20 Claims, 7 Drawing Sheets

(56) References Cited

U.S. PATENT DOCUMENTS

2017/0368682 A1 12/2017 Danjo et al.
2018/0013439 A1* 1/2018 Pilly .................. H03D 7/14
2019/0385064 A1* 12/2019 Malaya ................ G06N 3/084
2021/0150326 A1* 5/2021 Grollier ................ G06N 3/049

OTHER PUBLICATIONS

Soman, K., Muralidharan, V., & Chakravarthy, V. S. (2018). An Oscillatory Neural Autoencoder Based on Frequency Modulation and Multiplexing. Frontiers in computational neuroscience, 12, 52. https://doi.org/10.3389/fncom.2018.00052 (Year: 2018).*
Nikonov et al., "Benchmarking Physical Performance of Neural Inference Circuits", Online. Available: http://arxiv.org/abs/1907.05748 (2019). 2019, 59 pages.
International Search Report & Written Opinion notified Oct. 22, 2020 for PCT Patent Application No. PCT/US2020/040512.
Jayaraj, A. et al., "Highly Digital Second-Order ΔΣ VCO ADC", IEEE Transactions on Circuits and Systems-I: Regular Papers. Feb. 21, 2019, vol. 6, pp. 1-11, p. 2, and figures 1-2.
Liyanagedera, C. et al., "Spin Torque Nano-Oscillator Based Oscillatory Neural Network", 2016 Int'l Joint Conference on Neural Networks (IJCNN). Nov. 2016, pp. 1387-1394. pp. 1389-1391, figures 6, 12-13.
Examination Report, IN App. No. 202247008716, Feb. 6, 2023, 6 pages.
Supplementary European Search Report and Search Opinion, EP App. No. 20868313.6, Jun. 20, 2023, 9 pages.

* cited by examiner

OSCILLATOR BASED NEURAL NETWORK APPARATUS

BACKGROUND

The scaling of the transistor according to Moore's law has propelled the unprecedented progress of traditional, Boolean computing over the last five decades. Recently, applications related to artificial intelligence (AI) and machine learning (ML) consume a larger share of computing. For these, Boolean computing is less efficient. This has spurred research in neural computing which covers a wide field of research; from neural network algorithms, which can be programmed on traditional Boolean hardware like CPUs (central processing units) or GPUs (graphics processor units) to neural network circuits implemented in specialized hardware—application specific engine.

A neural network is a computing system that performs inferences and learns patterns in the data by processing continuous signals with configurable circuit parameters, generally without task-specific programming. For example, a neural network may learn to identify a certain object from a picture or image. A neural network comprises a collection of processing units, called "neurons," that communicate with other neurons via connections, generally referred to as "synapses". A neural network generally has a few thousand to a few million units and millions of connections.

The operation of a neural network crucially depends on learning first, i.e. the process of varying weights to achieve the desired recognition. There are two types of learning: supervised and unsupervised. In supervised learning, the desired output of the network is known for certain classes of inputs. In unsupervised learning, the network converges to a set of outputs each corresponding to a class of inputs. Currently, there is no efficient unsupervised learning procedure for analog, cellular, or oscillator neutral networks.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments describe a neural network scheme that uses unsupervised learning in oscillator neural networks. Training occurs by varying the weights in proportion to the output from a frequency detector, in accordance with various embodiments. Inputs and initial weights are split into plurality of inputs and plurality of weights. In some embodiments, when each input and corresponding weight is analog in nature, then each input and corresponding weight are received by an analog adder or subtractor that generates a current indicating a difference between the input and corresponding weight. The current charges a capacitor, which develops a voltage on it. In some embodiments, a voltage buffer is coupled to the capacitor to buffer the voltage on the capacitor. An oscillator receives the voltage (e.g., buffered voltage) and generates an oscillating signal with a frequency that depends on the voltage received from the voltage buffer. Each input and corresponding weight goes through an identical circuit path having, for example, an analog adder or subtractor, capacitor, voltage buffer, and oscillator. In various embodiments, the outputs of each oscillator are shorted together and an averager (e.g., a node that shorts all the oscillator outputs) generates an oscillating signal with an average frequency $f_a$ (e.g., average of all frequencies of the oscillator outputs). The oscillators work as synapses. The average frequency is a synchronous frequency close to a center of distribution of the initial frequencies of each oscillator. The averager works as a neuron.

In various embodiments, each oscillator is coupled to a phase frequency detector (PFD) or frequency detector that is coupled to a charge pump (CP). The PFD coupled to the CP together provides a voltage which represents a difference between the average frequency $f_a$ and frequency of the corresponding oscillator (e.g., $f_1$ for oscillator 1). The analog adder or subtractor voltage then adds or subtracts the voltage from the analog input voltage and analog input weight. After several iterations of this process, the output voltage from the PDF and CP circuitry stabilizes to a nearly constant value compared to its previous value. At that point, in some embodiments, a memory saves the output voltage from the PDF and CP as a trained weight associated with that input. Likewise, a memory saves all such trained weights for each corresponding input. In some embodiments, an inference logic or chip perform fast inference of input data using the trained weights.

In various embodiments, a similar digital-input neural network scheme is provided where inputs and initial weights are digital in nature. In such a scheme, the inputs, weights, and changes to the learned weights are added/subtracted in a digital adder. Then the result of the digital adder drives the input of a digital-to-analog converter (DAC). The output voltage of the DAC in its turn controls the frequency of an oscillator. Also, an analog-to-digital converter (ADC) converts the output voltage from each PFD and CP circuitry to a digital data, and that digital data is then added or subtracted from the initial digital input and digital weight. After several iterations of this process, the output digital data from the ADC stabilizes to a nearly constant value compared to its previous values. At that point, a memory saves the output of the ADC as a trained weight associated with that input. In some embodiments, an inference chip uses the output of ADCs as trained weights to infer values or results for an input according to the trained weights. In some embodiments, a peak detector detects the peak frequency from the synchronous frequency to infer a value or a result of the inputs.

There are many technical effects of various embodiments. For example, the neural network scheme of various embodiments enable learning functionality in simpler smaller circuits, and make learning neural networks faster and more energy efficient. Further, frequency of oscillators is more robust to noise and jitter than pulse timing. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g , immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1:
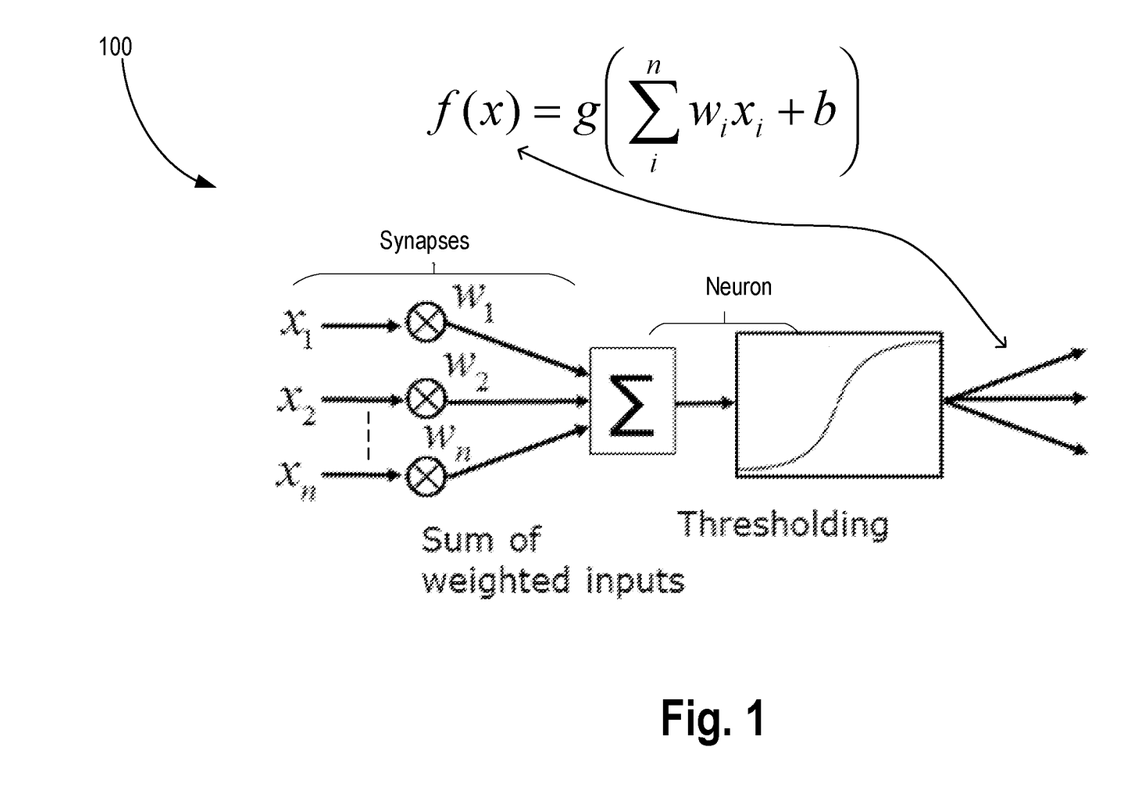
FIG. 1 illustrates a high-level general neural network scheme with weights trained using unsupervised learning apparatus, in accordance with some embodiments.

FIG. 1 illustrates a high-level neural network scheme 100 with weights and inputs, in accordance with some embodiments. A neural gate circuit is a building block of neural networks. It produces an output 'f' which is a non-linear function of an array of inputs x with n elements "$x_i$," and an array of stored weights "$w_i$", where 'i' is an integer index. Model 100 expresses a neural gate function:

$$f(x) = g(\Sigma_i^n w_i x_i + b) \quad (1)$$

where g( ) is a non-linear threshold function, and b is an offset that can be added to the sum. Here, the synapses perform the product of input 'x' with its corresponding weights 'w'. These synapses are elements of the neural gate executing analog multiplication. The neuron is the element performing summation of the synapse inputs and applying the non-linear threshold function.

Here, the dot product the vectors is expressed as:

$$y_i = (\Sigma_k^n w_{ki} x_i) \quad (2)$$

The operation of a neural network depends on learning first, i.e. the process of varying weights to achieve the desired recognition. There are two types of learning: supervised and unsupervised. In supervised learning, the desired output of the network is known for certain classes of inputs.

In unsupervised learning, when the network converges to a set of outputs each corresponding to a class of inputs. For unsupervised learning, the weights evolve or "train" according to some rule as multiple training inputs are provided, e.g., the following Hebbian rule:

$$\Delta w_{ij} = \eta x_j y_i \quad (3)$$

While an efficient method to implement unsupervised learning exists for spiking neural networks only, there is no workable solution today for analog, cellular or oscillator neural networks. They have to rely on supervised learning. One solution to unsupervised learning exists for spiking neural networks (SNN): spike timing dependent plasticity (STDP), which has an effect similar to that of the Hebbian rule. The circuits for STDP are designed such as to change the weights held in the memory of a synapse is varied according to the timing of pulses. However, the circuits for STDP work for SNN, which requires multiple spike for operation. This makes SNN typically slower and less energy efficient than other neural networks. Implementation of spiking circuity may be complicated, and STDP algorithm further exacerbates this complication resulting in larger circuit area and power.

Figure 2:
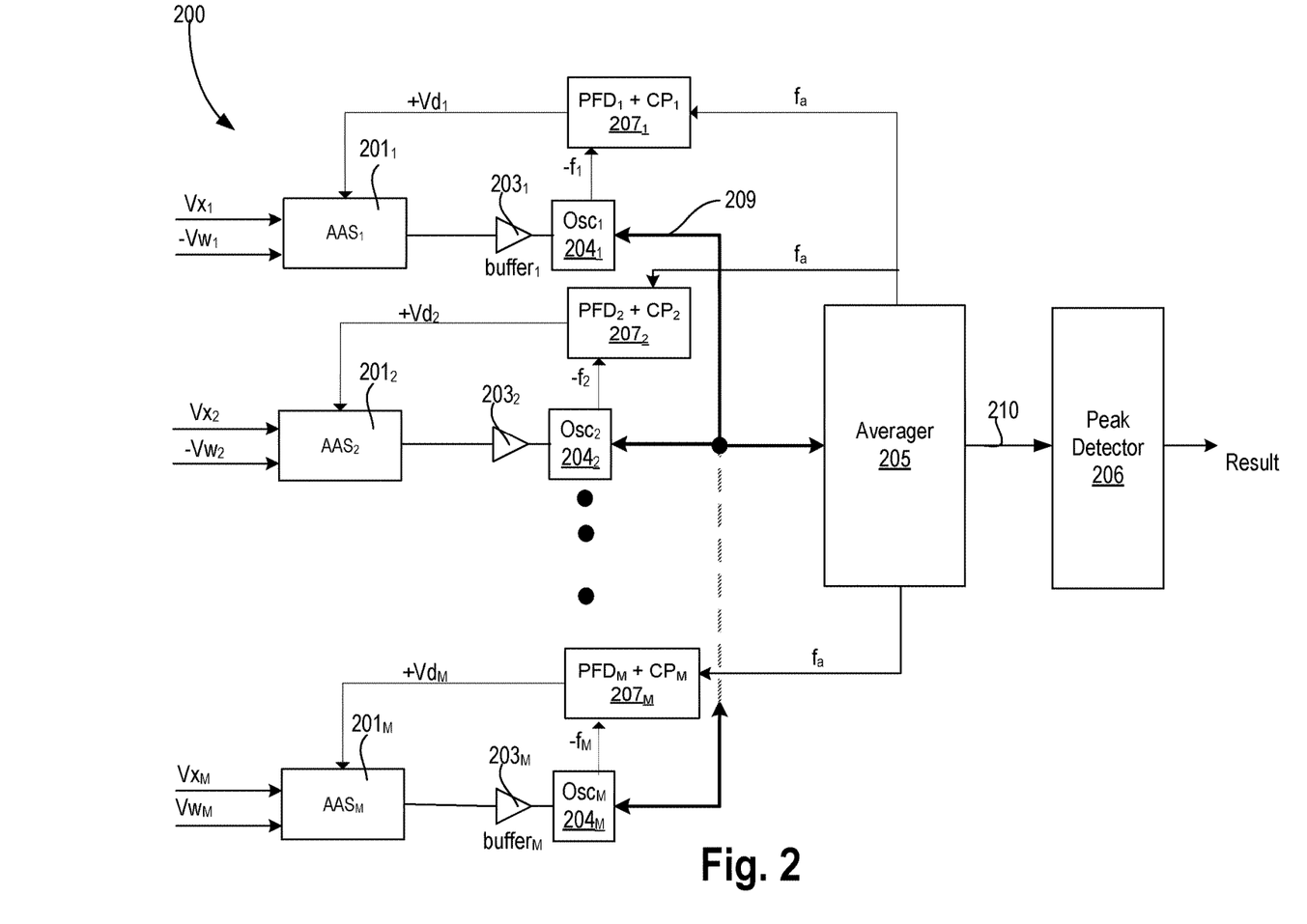
FIG. 2 illustrates a neural network scheme with analog weights trained using unsupervised learning apparatus using oscillators, in accordance with some embodiments.
Figure 3:
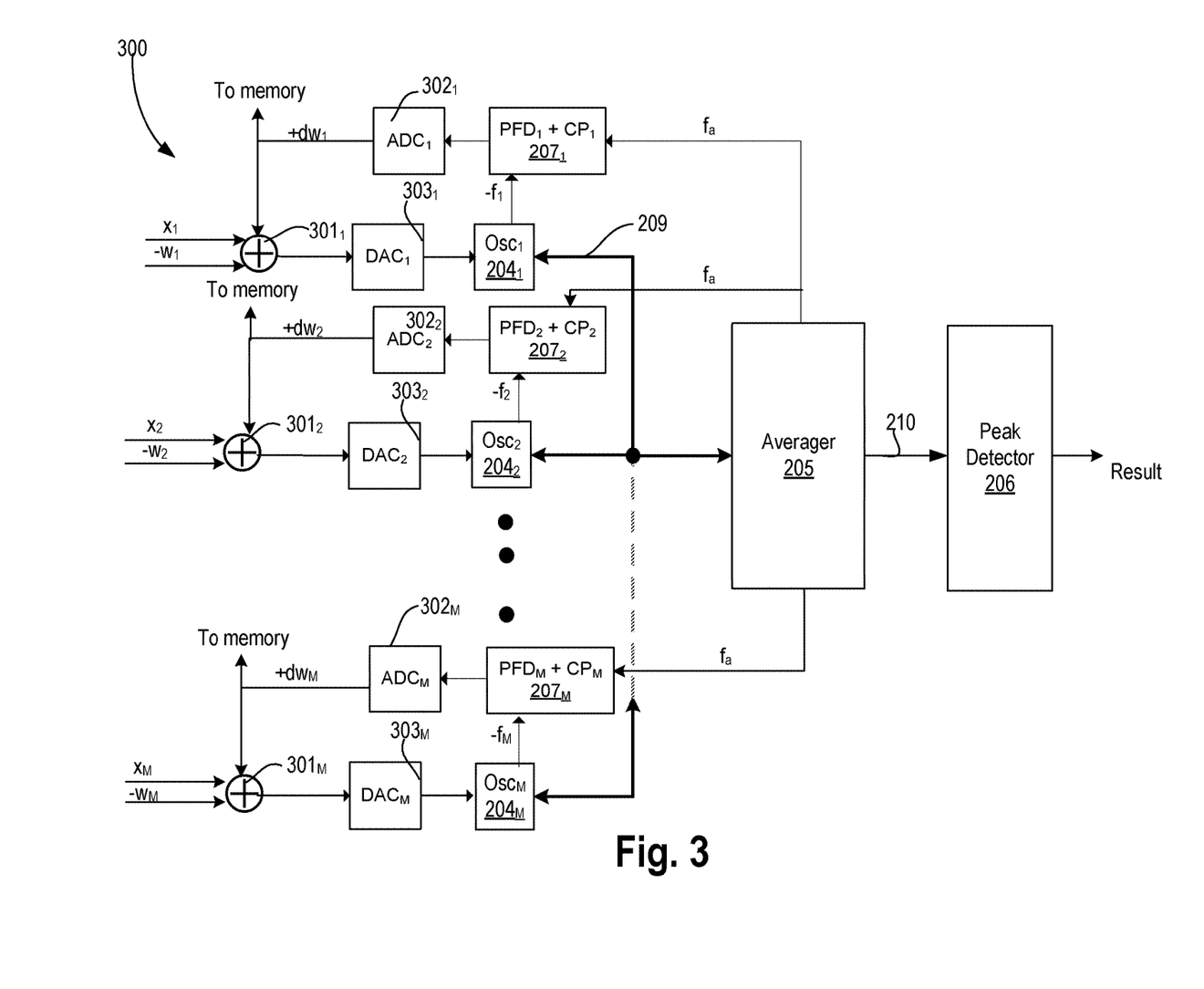
FIG. 3 illustrates a neural network scheme with digital weights trained using unsupervised learning apparatus using oscillators, in accordance with some embodiments.

The neural network scheme of various embodiments uses unsupervised learning in oscillator neural networks. Training occurs by varying the weights in proportion to the output from a frequency different detector, in accordance with various embodiments. FIGS. 2-3 describes such training apparatuses.

FIG. 2 illustrates a neural network scheme 200 with weights trained using unsupervised learning apparatus using oscillators, in accordance with some embodiments. The learning neural network scheme 200 comprises analog adders/subtractors (AAS) 201 (e.g., $201_{1-M}$, where M is an integer), voltage buffers 203 (e.g., $203_1$ through $203_M$), oscillators 204 (e.g., $204_1$ through $204_M$), averaging circuit 205, peak detector 206, and PDF and CP circuitries 207 (e.g., $207_1$ through $207_M$).

Figure 6:
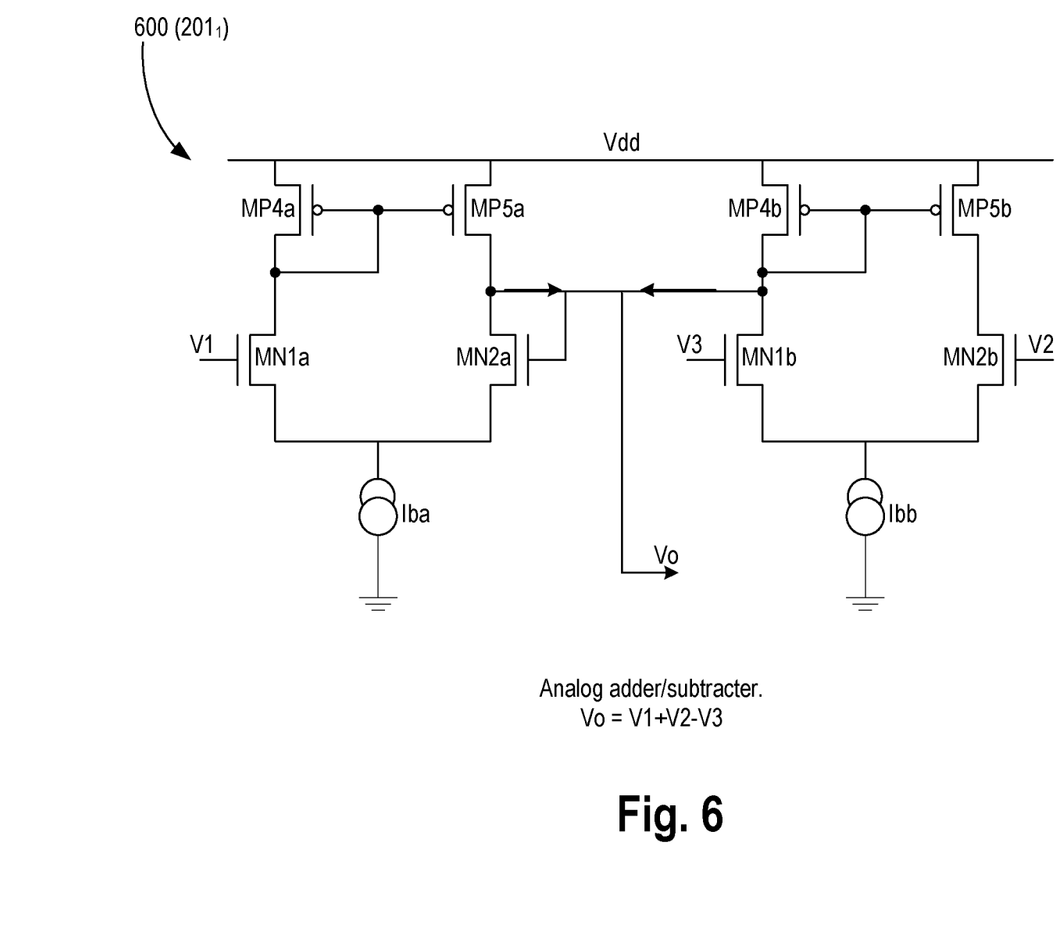
FIG. 6 illustrates an analog adder or subtractor for use in the apparatus of FIG. 2, in accordance with some embodiments.

In some embodiments, AAS 201 receive analog inputs (e.g., $Vx_{1-M}$) and initial to-be trained analog weights $Vw_{1-M}$. Depending on the implementation of AAS 201, the analog weights may be subtracted from analog inputs, which are indicated by a negative sign (e.g., $-Vw_{1-M}$). The input can be any analog input that is desired to be classified or identified. Any suitable analog voltage adder or subtractor can be used to subtract two inputs (e.g., $Vx_1$ and $Vw_1$) and subtract a new output from the PDF and CP circuitry 207 (e.g., $207_1$). One such example for AAS 201 is illustrated in FIG. 6.

Referring back to FIG. 2, in various embodiments, buffer 203 provides the buffered voltage as a control voltage to a corresponding oscillator 204. Each input and corresponding weight goes through an identical circuit path having, for example, AAS 201, buffer 203, and oscillator 204.

In various embodiments, each oscillator is coupled to a phase frequency detector (PFD) that is coupled to a charge pump (CP). The PFD coupled to the CP together is represented as circuitry 207 which provides a voltage that represents a difference between the average frequency $f_a$ and frequency of the corresponding oscillator (e.g., $f_1$ for $Osc_1$ $204_1$). The analog adder or subtractor AAS 201 then adds or subtracts the voltage from the analog input voltage x and analog input weight w.

Oscillators 204 are voltage controllable, so their initial frequency, $f_i$, is set by the difference of the input and weight vectors, where 'i' is an integer. Each oscillator 204 operates as synapses where input and weights are encoded as frequency of the oscillator. For example, frequency output of oscillator $204_1$ is expressed as:

$$f_1 = f_c + \Delta f(x_1 - w_1) \quad (4)$$

Frequency output of oscillator $204_2$ is expressed as:

$$f_2 = f_c + \Delta f(x_2 - w_2) \quad (5)$$

Frequency output of oscillator $204_3$ is expressed as:

$$f_3 = f_c + \Delta f(x_3 - w_3) \quad (6)$$

Frequency output of oscillator $204_M$ is expressed as:

$$f_M = f_c + \Delta f(x_M - w_M) \quad (7)$$

where, $f_c$ is the reference (center) frequency for this linear approximation.

The averaging circuitry 205 couples the oscillators 204 and synchronizes the frequency, $f_a$, close to the center of the distribution of initial frequencies of each oscillator. For instance, output 209 has an average frequency $f_a$, which becomes the oscillating frequency of all oscillators over time.

One example algorithm of weight change in learning is Oja's rule, which is given as:

$$\Delta w_{ij} = \eta(x_j - y_i) \quad (8)$$

One advantage of equation (8) is that the weights do not grow without a limit after long training.

In various embodiments, PFD and CP circuitry 207 determines a frequency difference between the frequency of an oscillating signal from an oscillator and from average 205. For example, $PFD_1$ and $CP_1$ circuitry $207_1$ compares a difference of signal from $Osc_1$ $204_1$ having frequency $f_1$ with signal from average 205 having frequency $f_a$, and generates a voltage output $Vd_1$ indicating the frequency difference.

By detecting the frequency difference of the averager 205 and each of the oscillators 204, equation (8) can be implemented, in accordance with some embodiments. For example:

$$\Delta w_i = C(f_i - f_a) \quad (9)$$

Equation (9) is equivalent to:

$$\Delta w_i = C(f_c + \Delta f(x_i - w_i) - f_a) \quad (10)$$

The output voltage Vd from each PFD and CP circuitry 207 is equivalent to $\Delta w_i$ which is subtracted from the difference in input and initial weight. For example, $AAS_1$ subtracts Vd1 from the difference of $Vx_1$ and $Vw_1$. The new current (which is output of $AAS_1$) then results in a new signal frequency $f_1$, which in turn results in a new $Vd_1$.

After several iterations of this process, the output voltage Vd from the PDF and CP circuitry 207 stabilizes to a nearly constant value compared to its previous value. At that point, a memory (not shown), such as an analog memory, saves the output voltage Vd from the PDF and CP 207 as a trained weight associated with that input. The memory can be a volatile memory or non-volatile memory. Examples of memory include phase change memory (PCM), floating gate (flash) memory (e.g., NAND, NOR flash), dynamic random access memory (DRAM), magnetic RAM (MRAM), resistive RAM (ReRAM), ferroelectric RAM (FeRAM), etc. Likewise, a memory saves all such trained weights for each corresponding input. In some embodiments, an inference logic or chip performs fast inference of input data using the trained weights.

In various embodiments, oscillators 204 are current mode oscillators. For example, output from buffer 203 is used to modify current through the oscillator and hence its' oscillating frequency. In some embodiments, oscillators 204 are voltage mode oscillators. For example, output from buffer 203 is used to modify gate bias of a transistor of the oscillator and hence its' oscillating frequency. In some embodiments, oscillators 204 comprise ring oscillators. In some embodiments, oscillators 204 comprises an LC (inductor-capacitor) oscillator.

In some embodiments, the output 210 $f_a$ from averager 205 is further processed to generate a result (e.g., a classification of input data x). In some embodiments, peak detector 205 determines the peak frequency from the synchronous frequency $f_a$ to infer a value or a result of the inputs. Any suitable circuit for determining a peak detector can be used for peak detector 206.

FIG. 3 illustrates a neural network scheme 300 with digital weights trained using unsupervised learning apparatus using oscillators, in accordance with some embodiments. Scheme 300 is similar to scheme 200 but for digital inputs x and weights w. Here, AAS is replaced with a digital adder/subtractor such as digital adder/subtractor 301. In some embodiments, the carry value in the digital adder/subtractor 301 is calculated by a majority logic gate that outputs a logic value which is a majority of the inputs x, w, and dw. For example, digital adder/subtractor $301_1$ performs the function of $x_1$-$w_1$-$dw_1$. Any suitable digital adder/subtractor can be used to implement the adders/subtractors 301.

ADC 302 (such as ADCs $302_{1-M}$) is used to convert the output of PFD and CP circuitry 207 to generate dw. For example, ADC $302_1$ is used to convert the analog output of circuitry $207_1$ into a corresponding digital value. This digital code $w_1$ is then subtracted (or added) from a difference of $x_1$ and $w_1$. In various embodiments, x, w, and dw are multi-bit signals. The result of digital addition/subtraction 301 is provided to the input of a DAC 303. The output value of the voltage in conjunction with an output current of DAC 303 is used to drive the oscillator 204 and thus to control its frequency.

ADCs are apparatuses that convert continuous physical quantities (e.g., voltages) to digital numbers that represent the amplitude of the physical quantities. In some embodiments, ADCs $302_{1-M}$ convert the analog output of circuitry 207 to their corresponding digital representations. Any suitable ADC may be used to implement ADCs $302_{1-M}$. For example, ADCs $302_{1-M}$ is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. For purposes of explaining the various embodiments, ADCs $302_{1-M}$ are considered to be flash ADCs.

A DAC is an apparatus that converts digital data (e.g., binary or thermometer coded) into an analog signal (current, voltage, or electric charge). In some embodiments, DACs $303_{1-M}$ are pulse width modulator DACs. In other embodiments, other types of DACs may be used for implementing DACs $303_{1-M}$. For example, interpolating DACs (also known as oversampling DACs), binary weighted DACs (e.g., switched resistor DACs, switched capacitor DACs, switched current-source DACs), R-2R ladder DAC, thermometer coded DAC, segmented DAC, etc. may be used for implementing DACs $303_{1-M}$. Any suitable DAC may be used for implementing DACs $303_{1-M}$.

Figure 4:
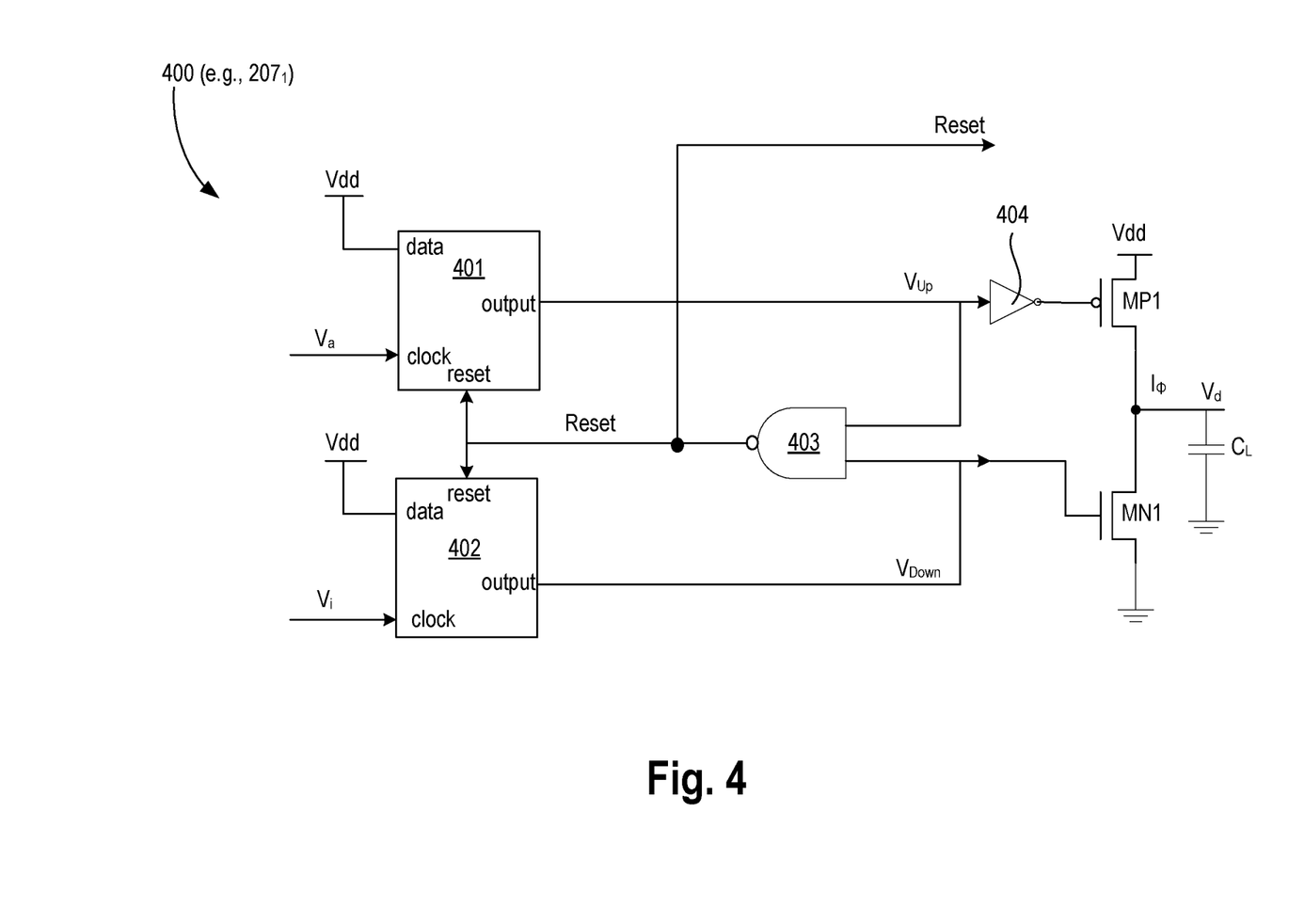
FIG. 4 illustrates a circuitry with a phase frequency detector and a charge pump for use in the apparatuses of FIG. 2 and FIG. 3, in accordance with some embodiments.

FIG. 4 illustrates circuitry 400 with phase frequency detector and charge pump for use in the apparatuses of FIG. 2 and FIG. 3, in accordance with some embodiments.

Circuitry 400 comprises flip-flops 401 and 402, NAND gate 403, inverter 404, p-type device MP1 and n-type device MN1 coupled as shown. Inputs Va and Vi are received as clock inputs by flip-flops 401 and 402, respectively, that generate up and down voltages $V_{Up}$ and $V_{Down}$, respectively. These up and down cause flip-flops 401 and 402 to reset. The difference in $V_a$ and $V_i$ is converted into a corresponding current $I_{cp}$ by charge pump transistors MP1 and MN1. This current $I_{cp}$ charges a capacitor $C_L$ to develop a voltage $V_d$. For neural network 200, Vd is subtracted by AAS. For neural network 300, Vd is converted into digital form by ADC 302.

Figure 5:
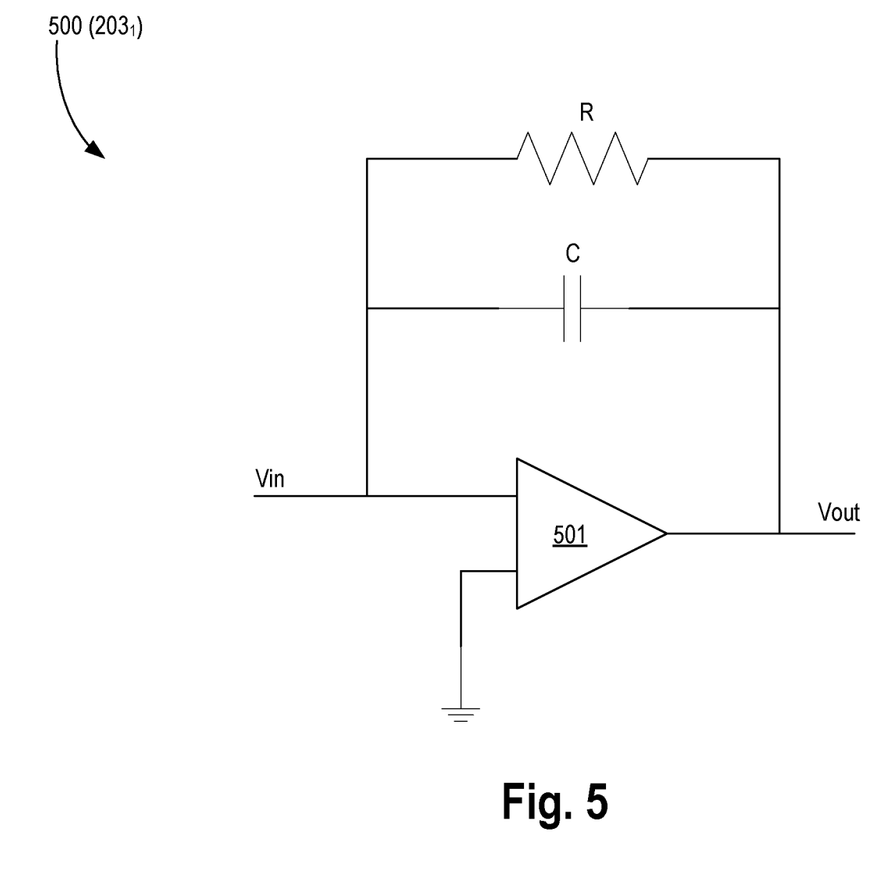
FIG. 5 illustrates a voltage buffer for use in the apparatus of FIG. 2 and FIG. 3, in accordance with some embodiments.

FIG. 5 illustrates voltage buffer 500 for use in the apparatus of FIG. 2 and FIG. 3, in accordance with some embodiments. Voltage buffer 500 comprises amplifier 501, feedback capacitor C and feedback resistor R. Any suitable single-stage or multi-stage amplifier can be used to implement amplifier 501. The input Vin of buffer 500 is coupled to the output of AAS. The output Vout of buffer 500 is coupled to the input of oscillator 204. The feedback resistor R and capacitor C are implemented in any suitable way. For example, resistor R is implemented as a transistor operating in linear region, a discrete resistor provided by a process node, or a combination of them. In various embodiments, resistance of resistor R is programmable by hardware (e.g., fuses, registers), or software (e.g., firmware, operating system).

In some embodiments, capacitor C (e.g., $C_L$) of various figures is implemented as discrete capacitor, metal-insulator-metal (MIM) capacitor, metal capacitor, ferroelectric capacitor, transistor configured as a capacitor, or a combination of them. In various embodiments, capacitance of capacitor C is programmable by hardware (e.g., fuses, registers), or software (e.g., firmware, operating system).

FIG. 6 illustrates analog adder or subtractor (AAS) 600 (e.g., $201_1$) for use in the apparatus of FIG. 2, in accordance with some embodiments. In some embodiments, AAS 600 comprises p-type transistors MP4a, MP5a, MP4b, and MP5b; n-type transistors MN1a, MN2a, MN1b, and MN2b, and current sources Iba and Ibb coupled as shown. The inputs are V1, V2, and V3, and the output is Vo. Voltage at the output node Vo is provided to AAS 201.

Figure 7:
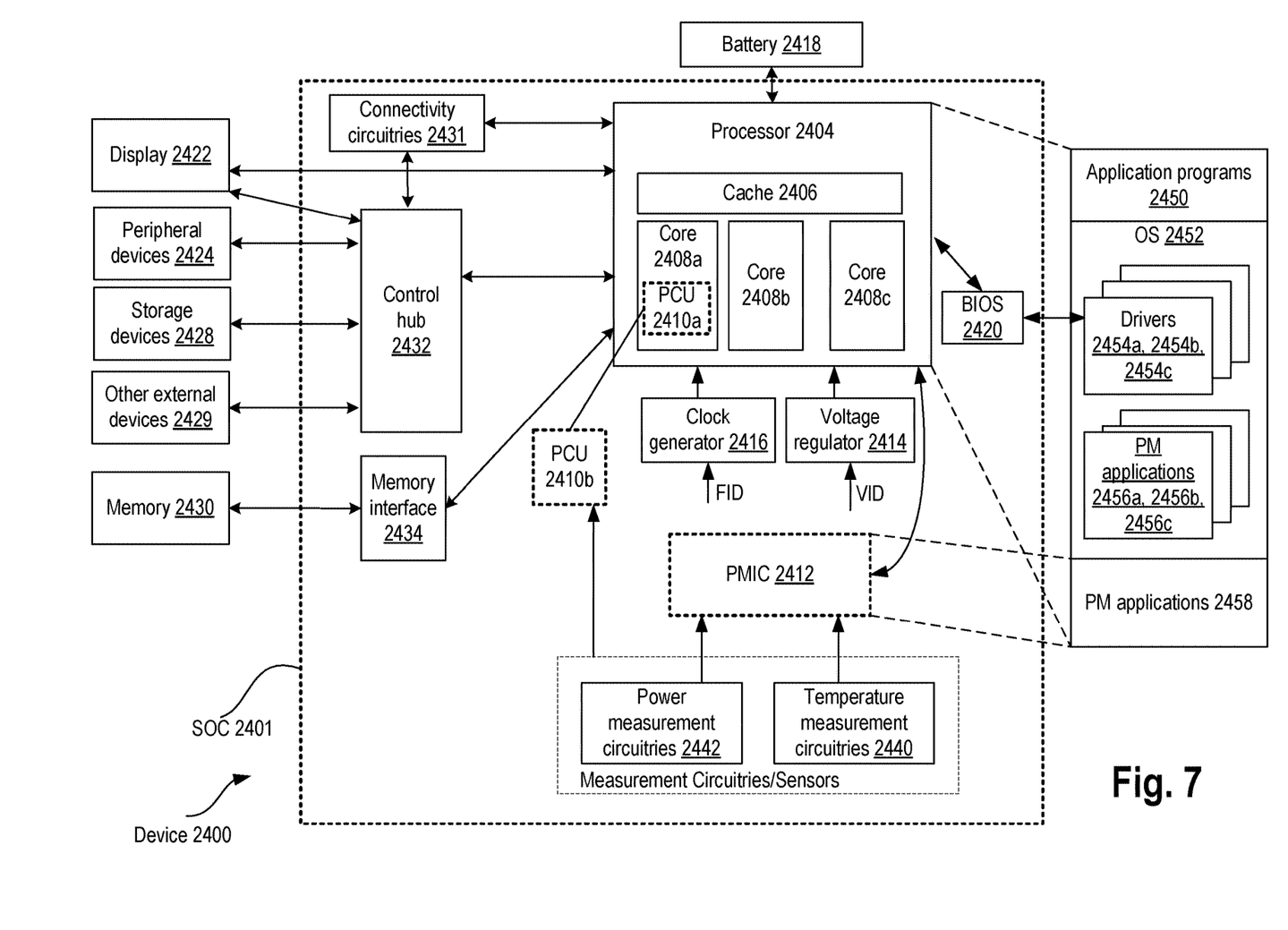
FIG. 7 illustrates a smart device, or a computer system, or a SoC (System-on-Chip) with a neural network scheme with weights trained using unsupervised learning apparatus using oscillators, according to some embodiments of the disclosure.

FIG. 7 illustrates a smart device, or a computer system, or a SoC (System-on-Chip) with a neural network scheme with weights trained using unsupervised learning apparatus with oscillators, according to some embodiments of the disclosure. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 7, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O. In various embodiments, the neural network scheme with weights trained using unsupervised learning apparatus using oscillators is implemented by processor 2404.

In some embodiments, processor 2404 includes multiple processing cores (also referred to as cores) 2408*a*, 2408*b*, 2408*c*. Although merely three cores 2408*a*, 2408*b*, 2408*c* are illustrated, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414 VR having a high bandwidth and low power differential-to-single-ended type-III compensator. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410*a/b* and/or PMIC 2412. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals. Clock generator 2416 is an adaptive clock source that can provide an adaptive frequency output as discussed with reference to various embodiments.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 (e.g., SCVR) and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a plurality of adders or subtractors, each of which is to receive an input voltage, a corresponding initial weight voltage, and a corresponding adjustment voltage; a plurality of buffers, wherein each buffer is coupled to an adder or subtractor of the plurality of adders or subtractors; a plurality of oscillators, wherein each oscillator is coupled to an output of an individual buffer of the plurality of buffers; an averager coupled to the plurality of oscillators, wherein the average is to generate a signal with a frequency being an average of frequencies of outputs of the plurality of oscillators; and a plurality of frequency detectors, wherein each frequency detector is coupled to an individual oscillator and the averager, and also coupled to an individual adders or subtractor of the plurality of adders or subtractor.

Example 2: The apparatus of claim 1, wherein each oscillator is a current controlled or voltage controlled oscillator.

Example 3: The apparatus of claim 1, wherein each buffer is a voltage buffer comprising an amplifier.

Example 4: The apparatus of claim 1 comprises a peak detector coupled to an output of the averager.

Example 5: The apparatus of claim 1, wherein each frequency detector generates a signal indicative of a difference between the average of frequencies and the frequency of the signal from the individual oscillator.

Example 6: The apparatus of claim 1, wherein output of each adder or subtractor is a trained weight.

Example 7: The apparatus of claim 6 comprises memory to store the trained weight.

Example 8: The apparatus of claim 1, wherein each adder or subtractor is to subtract a corresponding initial weight voltage and a corresponding adjustment voltage from an input voltage.

Example 9: The apparatus of claim 1, wherein each frequency detector is coupled to a charge pump which is coupled to an individual adder or subtractor.

Example 10: The apparatus of claim 1, wherein each adder or subtractor is an analog adder or subtractor.

Example 11: An apparatus comprising: a plurality of digital adders or subtractors, each of which is to receive an input code, a corresponding initial weight code, and a corresponding adjustment code; a plurality of digital-to-analog converters (DACs), wherein each DAC is coupled to an individual digital adder or subtractor of the plurality of digital adders or subtractors; a plurality of oscillators, wherein each oscillator is coupled to an output of an individual DAC of the DACs; an averager coupled to the plurality of oscillators, wherein the average is to generate a signal with a frequency being an average of frequencies of outputs of the plurality of oscillators; and a plurality of frequency detectors, wherein each frequency detector is coupled to an individual oscillator and the average; and a plurality of analog-to-digital converters (ADCs), wherein each ADC is coupled to an individual digital adder or subtractor.

Example 12: The apparatus of claim 11, wherein each frequency detector is coupled to a charge pump which is coupled to an individual ADC.

Example 13: The apparatus of claim 11, wherein output of each digital adder or subtractor is a trained weight.

Example 14: The apparatus of claim 13 comprises memory to store the trained weight.

Example 15: The apparatus of claim 11, wherein each oscillator is a current controlled or voltage controlled oscillator.

Example 16: The apparatus of claim 11 comprises a peak detector coupled to an output of the averager.

Example 17: A system comprising: a memory; a processor with a neural network circuitry which includes: a plurality of adders or subtractors, each of which is to receive an input voltage, a corresponding initial weight voltage, and a corresponding adjustment voltage; a plurality of buffers, wherein each buffer is coupled to an adder or subtractor of the plurality of adders or subtractors; a plurality of oscillators, wherein each oscillator is coupled to an output of an individual buffer of the plurality of buffers; an averager coupled to the plurality of oscillators, wherein the average is to generate a signal with a frequency being an average of frequencies of outputs of the plurality of oscillators; and a plurality of frequency detectors, wherein each frequency detector is coupled to an individual oscillator and the averager, and also coupled to an individual adders or subtractor of the plurality of adders or subtractor; and a wireless interface to allow the processor to communicate with another device.

Example 18: The system of claim 17, wherein output of each adder or subtractor is a trained weight.

Example 19: The system of claim 18, wherein memory is to store the trained weight.

Example 20: The system of claim 17, wherein the neural network circuitry comprises a peak detector coupled to an output of the averager.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a plurality of adders or subtractors, each of which is to receive an input voltage, a corresponding initial weight voltage, and a corresponding adjustment voltage;
   a plurality of buffers, wherein each buffer is coupled to an adder or subtractor of the plurality of adders or subtractors;
   a plurality of oscillators, wherein each oscillator is coupled to an output of an individual buffer of the plurality of buffers;
   an averager coupled to the plurality of oscillators, wherein the average is to generate a signal with a frequency being an average of frequencies of outputs of the plurality of oscillators; and
   a plurality of frequency detectors, wherein each frequency detector is coupled to an individual oscillator and the averager, and also coupled to an individual adders or subtractor of the plurality of adders or subtractor, wherein an output of each adder or subtractor corresponds to a sum of the input voltage, the corresponding initial weight voltage, and the corresponding adjustment voltage.

2. The apparatus of claim 1, wherein each oscillator is a current controlled or voltage controlled oscillator.

3. The apparatus of claim 1, wherein each buffer is a voltage buffer comprising an amplifier.

4. The apparatus of claim 1 comprising a peak detector coupled to an output of the averager.

5. The apparatus of claim 1, wherein each frequency detector generates a signal indicative of a difference between the average of frequencies and the frequency of the signal from the individual oscillator.

6. The apparatus of claim 1, wherein each adder or subtractor is to subtract the corresponding initial weight voltage and the corresponding adjustment voltage from the input voltage.

7. The apparatus of claim 1, wherein each frequency detector is coupled to a charge pump which is coupled to an individual adder or subtractor.

8. The apparatus of claim 1, wherein each adder or subtractor is an analog adder or subtractor.

9. The apparatus of claim 1, wherein the corresponding adjustment voltage, once stabilized at or near a constant value, is a trained weight.

10. The apparatus of claim 9 comprising a memory to store the trained weight.

11. An apparatus comprising:
    a plurality of digital adders or subtractors, each of which is to receive an input code, a corresponding initial weight code, and a corresponding adjustment code;
    a plurality of digital-to-analog converters (DACs), wherein each DAC is coupled to an individual digital adder or subtractor of the plurality of digital adders or subtractors;
    a plurality of oscillators, wherein each oscillator is coupled to an output of an individual DAC of the DACs;
    an averager coupled to the plurality of oscillators, wherein the average is to generate a signal with a frequency being an average of frequencies of outputs of the plurality of oscillators; and
    a plurality of frequency detectors, wherein each frequency detector is coupled to an individual oscillator and the average; and
    a plurality of analog-to-digital converters (ADCs), wherein each ADC is coupled to an individual digital adder or subtractor, wherein an output of each digital adder or subtractor corresponds to a sum of the input code, the corresponding initial weight code, and the corresponding adjustment code.

12. The apparatus of claim 11, wherein each frequency detector is coupled to a charge pump which is coupled to an individual ADC.

13. The apparatus of claim 11, wherein each oscillator is a current controlled or voltage controlled oscillator.

14. The apparatus of claim 11 comprising a peak detector coupled to an output of the averager.

15. The apparatus of claim 11, wherein the corresponding adjustment code, once stabilized at or near a constant value, is a trained weight.

16. The apparatus of claim 15 comprising memory to store the trained weight.

17. A system comprising:
a memory;
a processor with a neural network circuitry which includes:
- a plurality of adders or subtractors, each of which is to receive an input voltage, a corresponding initial weight voltage, and a corresponding adjustment voltage;
- a plurality of buffers, wherein each buffer is coupled to an adder or subtractor of the plurality of adders or subtractors;
- a plurality of oscillators, wherein each oscillator is coupled to an output of an individual buffer of the plurality of buffers;
- an averager coupled to the plurality of oscillators, wherein the average is to generate a signal with a frequency being an average of frequencies of outputs of the plurality of oscillators; and
- a plurality of frequency detectors, wherein each frequency detector is coupled to an individual oscillator and the averager, and also coupled to an individual adders or subtractor of the plurality of adders or subtractor, wherein an output of each adder or subtractor corresponds to a sum of the input voltage, the corresponding initial weight voltage, and the corresponding adjustment voltage; and
- a wireless interface to allow the processor to communicate with another device.

18. The system of claim 17, wherein the neural network circuitry comprises a peak detector coupled to an output of the averager.

19. The apparatus of claim 17, wherein the corresponding adjustment voltage, once stabilized at or near a constant value, is a trained weight.

20. The system of claim 19, wherein the memory is to store the trained weight.

* * * * *